United States Patent
Parris et al.

(10) Patent No.: US 6,731,156 B1
(45) Date of Patent: May 4, 2004

(54) HIGH VOLTAGE TRANSISTOR PROTECTION TECHNIQUE AND SWITCHING CIRCUIT FOR INTEGRATED CIRCUIT DEVICES UTILIZING MULTIPLE POWER SUPPLY VOLTAGES

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/360,082
(22) Filed: Feb. 7, 2003
(51) Int. Cl.$^7$ .............................................. H03K 17/687
(52) U.S. Cl. ...................... 327/427; 327/333; 327/112
(58) Field of Search ................................ 327/108, 112, 327/328, 333, 391, 427, 437, 434, 574, 576, 581; 326/68, 81, 119, 121, 80

(56) References Cited

U.S. PATENT DOCUMENTS

| 3,623,023 A | 11/1971 | Oleksiak | 327/427 |
|---|---|---|---|
| 4,069,430 A | 1/1978 | Masuda | 326/87 |
| 5,389,842 A | 2/1995 | Hardee | 327/391 |
| 5,729,155 A * | 3/1998 | Kobatake | 326/68 |
| 5,748,025 A | 5/1998 | Ng et al. | 327/333 |
| 5,777,497 A | 7/1998 | Han | 327/108 |
| 5,917,348 A | 6/1999 | Chow | 327/108 |
| 6,266,291 B1 | 7/2001 | Sher et al. | 365/226 |
| 6,320,414 B1 * | 11/2001 | Annema et al. | 326/80 |
| 6,580,306 B2 * | 6/2003 | Hardee | 327/328 |

OTHER PUBLICATIONS

Hodges et al, Analysis And Design Of Digital Integrated Circuits, 1988, McGraw–Hill, Inc., $2^{nd}$ Edition, pp. 91–92.*

* cited by examiner

Primary Examiner—Long Nguyen
(74) Attorney, Agent, or Firm—William J. Kubida; Peter J. Meza; Hogan & Hartson LLP

(57) ABSTRACT

A high voltage transistor protection technique and switching circuit of especial applicability to integrated circuit devices utilizing multiple power supply voltages. In accordance with the technique of the present intention, the problems inherent in the amount of on-chip die area consumed and speed degradation of prior art circuit implementations are overcome by furnishing a substantially direct current voltage $V_{HVP}$ to the gate of a first transistor of a series connected thin gate oxide pair wherein $V_{HVP} \leq V_{DSMAX}$ (the maximum gate-to-source voltage of the first transistor) and $V_{HVP} \leq V_{DSMAX} + V_t$ (the maximum drain-to-source voltage of the second transistor plus the threshold voltage of the first transistor).

18 Claims, 2 Drawing Sheets

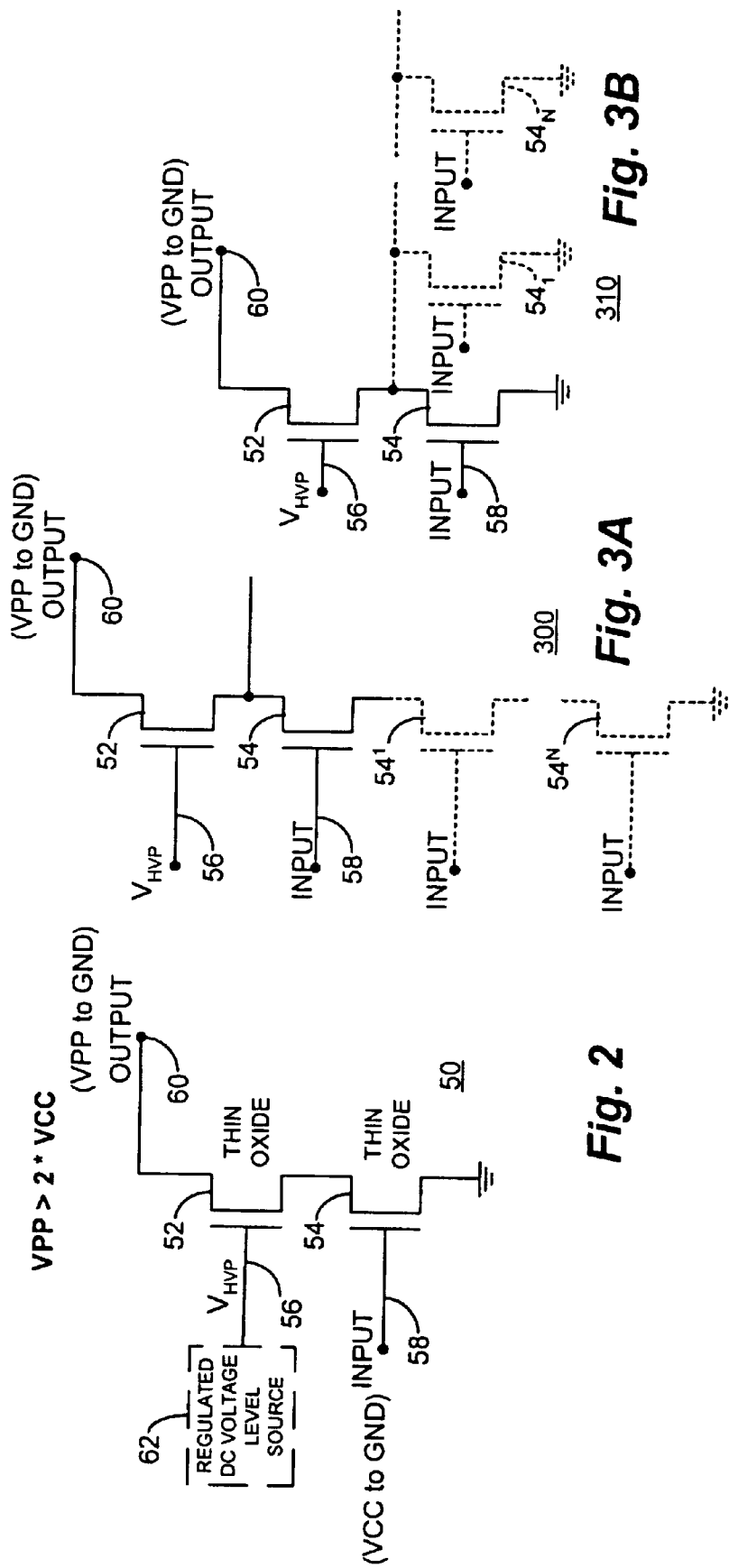

US 6,731,156 B1

HIGH VOLTAGE TRANSISTOR PROTECTION TECHNIQUE AND SWITCHING CIRCUIT FOR INTEGRATED CIRCUIT DEVICES UTILIZING MULTIPLE POWER SUPPLY VOLTAGES

BACKGROUND OF THE INVENTION

The present invention relates, in general, to the field of integrated circuit ("IC") devices. More particularly, the present invention relates to a high voltage transistor protection technique and switching circuit of especial applicability to integrated circuit devices utilizing multiple power supply voltages.

In certain integrated circuit devices (e.g. some memory ICs) a high voltage supply level ("$V_{PP}$") may be required for proper device operation. When $V_{PP}$ is less than to equal to twice the supply voltage ("$V_{CC}$"), i.e. $V_{PP} \leq 2^*V_{CC}$, then in certain technologies, a single protect transistor may be utilized in a switching circuit wherein the output must be switched between $V_{PP}$ and circuit ground ("GND" or "$V_{SS}$"). The resultant structure is a series connected pair of relatively thin gate oxide MOS transistors coupled between the output node and $V_{SS}$ with the gate of the upper device coupled to $V_{CC}$ and the gate of the lower device defining an input node receiving a switched source of $V_{CC}$.

In those applications wherein the high voltage supply level is more than twice the device supply voltage ("$V_{CC}$") i.e. $V_{PP} > 2^*V_{CC}$, then a switching circuit comprising a relatively thick gate oxide MOS transistor in series with a pair of series connected relatively thin gate oxide MOS transistors may be coupled between the output node and $V_{SS}$ with the gate of the thick gate oxide device coupled to a source of $V_{PP}$, the gate of the intermediate N-channel device coupled to $V_{CC}$ and the gate of the remaining N-channel device coupled to an input node receiving a switched source of $V_{CC}$.

In general, prior art switching circuits for use in devices requiring multiple voltage supply levels, particularly those wherein $V_{PP} > 2^*V_{CC}$, have required many transistors in series to convert voltage levels. This results in the consumption of a relatively large amount of on-chip die area for the layout of these circuits along with concomitant device speed degradation.

SUMMARY OF THE INVENTION

The high voltage transistor protection technique, of the present invention overcomes the problems inherent in the amount of on-chip die area consumed an d speed degradation of prior art circuit implementations and is of particular applicability to integrated circuit devices employing multiple power supply voltages.

Particularly disclosed herein is a switching circuit for operation in conjunction with a first supply voltage $V_{PP}$ and a second lower supply voltage $V_{CC}$ wherein $V^{PP} > 2^*V_{CC}$. The circuit comprises a first transistor having an input terminal thereof coupled between an output of the circuit and an intermediate node with the output capable of transitioning between $V_{PP}$ and a reference voltage level. A second transistor having a switching input thereof is coupled between the intermediate node and a reference voltage line. A substantially direct current voltage source is coupled to the input terminal of the first transistor for supplying a voltage $V_{HVP}$ less than or substantially equal to a maximum gate-to-source voltage $V_{GSMAX}$ of the first transistor. In a preferred embodiment, the voltage $V_{HVP}$ is also less than or substantially equal to a maximum drain-to-source voltage $V_{DSMAX}$ of the second transistor plus a threshold voltage $V_t$ of the first transistor.

Further provided herein is a transistor protection method for a switching circuit having an output transitioning between a first supply voltage $V_{PP}$ and a reference voltage level and an input transitioning between a second supply voltage level $V_{CC}$ and the reference voltage level wherein $V_{PP} > 2^*V_{CC}$. The method comprises the steps of providing at least two transistors in series between the output and the reference voltage level, providing a substantially direct current voltage $V_{HVP}$ to a gate terminal of a first transistor, wherein $V_{HVP}$ is less than or substantially equal to a maximum gate-to-source voltage $V_{GSMAX}$ of the first transistor and coupling the input to a gate terminal of the second transistor. In accordance with a preferred method, the substantially direct current voltage $V_{HVP}$ is less than or substantially equal to a maximum drain-to-source voltage $V_{DSMAX}$ of the second transistor plus a threshold voltage $V_t$ of the first transistor.

BRIEF DESCRIPTION OF THE DRAWINGS

The aforementioned and other features and objects of the present invention arid the manner of attaining them will become more apparent and the invention itself will be best understood by reference to the following description of a preferred embodiment taken in conjunction with the accompanying drawings, wherein:

FIG. 2 is a schematic illustration of a representative circuit in accordance with the present invention implementing a high voltage transistor protection technique of especial applicability to integrated circuit devices utilizing multiple power supply voltages;

FIG. 3A is a schematic illustration of the circuit of FIG. 2 implemented in the form of a multi-input NAND gate including one or more additional transistors in series with the lower switching transistor; and FIG. 3B is an additional schematic illustration of the circuit of FIG. 2 implemented in the form of a multi-input NOR gate including one or more additional transistors in parallel with the lower switching transistor.

DESCRIPTION OF A REPRESENTATIVE EMBODIMENT

Figure 1B:
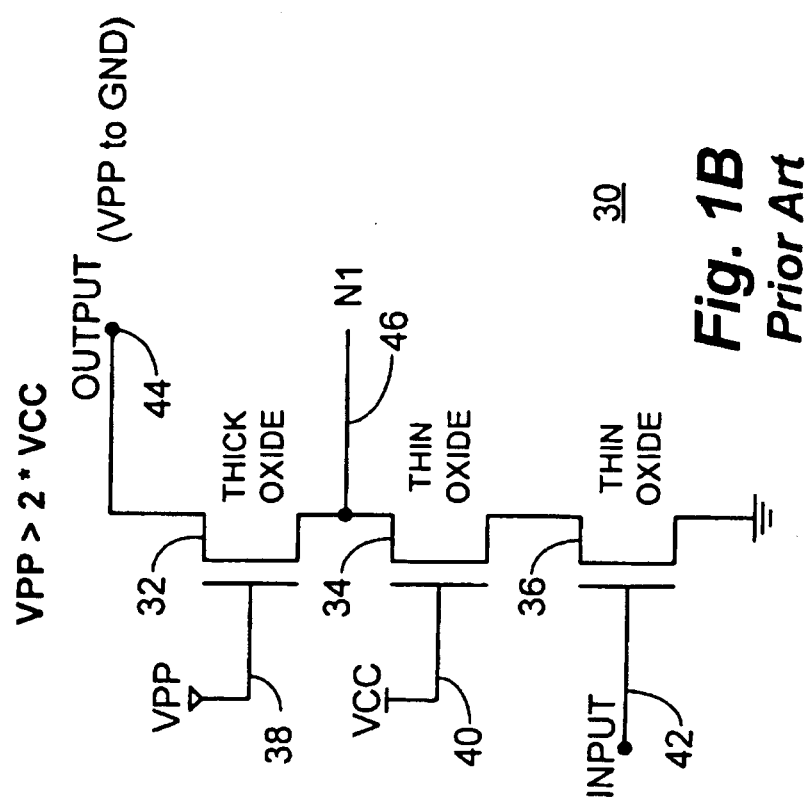
FIG. 1B is a further schematic illustration of a prior art circuit comprising a three N-channel transistor series stack as typically utilized in certain technologies in which the output needs to be switched from $V_{PP}$ to circuit ground when $V_{PP} > 2^*V_{CC}$.
Figure 1A:
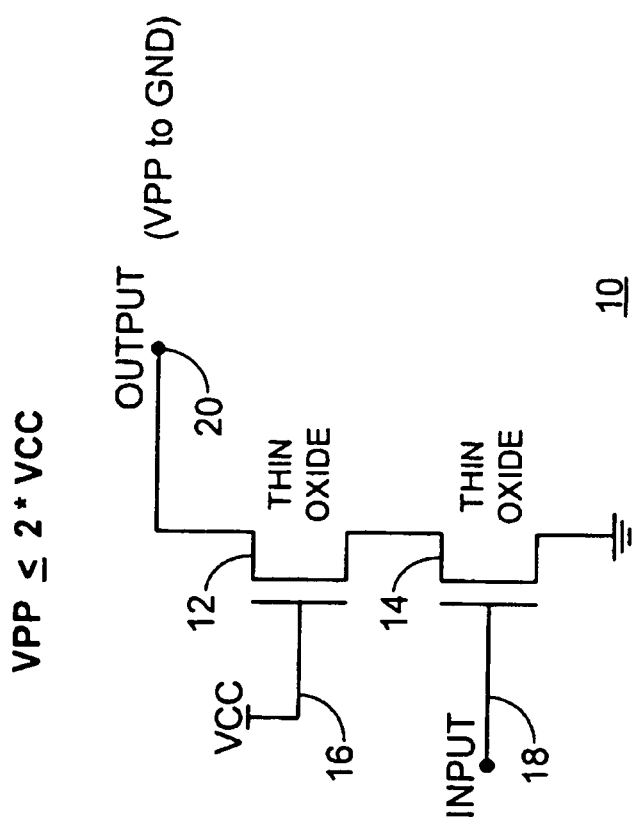
FIG. 1A is a schematic illustration of a prior art circuit comprising a two N-channel transistor series stack utilizing a single protect transistor as typically utilized in certain technologies in which the output also needs to be switched from $V_{PP}$ to circuit ground when $V_{PP} \leq 2^*V_{CC}$.

With reference to FIG. 1A, a schematic illustration of a prior art circuit 10 is shown. The circuit 10 comprises a two transistor series stack including a thin oxide. N-channel transistor 12 with another thin oxide N-channel transistor 14, with the former utilized as a single protect transistor. The circuit 10 is typically utilized in certain technologies in which the output must be switched from $V_{PP}$ to circuit ground but in those circumstances wherein $V_{PP} \leq 2^*V_{CC}$. In the circuit 10, the gate terminal 16 of transistor 12 is coupled to $V_{CC}$ while line 18 defines an input at the gate terminal of transistor 14. An output 20 is taken at the drain terminal of transistor 12.

With reference additionally now to FIG. 1B, a schematic illustration of a prior art circuit 30 is shown. The circuit 30 comprises a three transistor series stack including a thick oxide N-channel transistor 32 and thin oxide N-channel transistors 34 and 36. The circuit 30 is typically utilized in certain technologies in which the output also needs to be switched from $V_{PP}$ to circuit ground when $V_{PP} > 2*V_{CC}$.

The circuit 30 has a potential of $V_{PP}$ applied to the gate 38 of transistor 32 and a potential of $V_{CC}$ applied to the gate 40 of transistor 34. An input on line 42 is connected to the gate of transistor 38 and an output 44 is defined at the drain of transistor 32 which transitions between $V_{PP}$ and circuit ground. A node ("N1") is defined at the connection point between transistors 32 and 34.

With reference to the preceding figures, when a "pumped" power supply voltage ($V_{PP}$) becomes "high" with respect to a supply voltage ($V_{CC}$), high voltage protection techniques are required. For example, the N-channel transistor series stack of the circuit 30 illustrated in FIG. 1B is utilized in certain technologies. In this circuit 30, the output 44 must to be switched from $V_{PP}$ to circuit ground. This three transistor stack is typically required when $V_{PP} > 2*V_{CC}$.

On the other hand, if $V_{PP} \leq 2*V_{CC}$, then a single protect transistor can be used (i.e. a two transistor stack) as shown in the circuit 10 of FIG. 1A. This protects the lower, active device (transistor 14) from having a drain-to-source voltage ($V_{DS}$) of $V_{DS} = V_{PP}$. The resulting $V_{DS}$ of each of these devices (transistors 12 and 14) then becomes $V_{PP}/2$. Therefore, if $V_{PP} \leq 2*V_{CC}$, then each $V_{DS} \leq V_{CC}$, just like a transistor with low voltage logic in this technology. Keeping the $V_{DS}$ of the N-channel transistors "low" is important so that "hot carrier injection" is not accelerated, which if not controlled, causes threshold voltage ($V_t$) shifts and transconductance degradation.

If $V_{PP} > 2*V_{CC}$ then the electric field across the gate oxide of transistor 12 becomes larger than $V_{CC}$ which may result in a reliability problem. In these cases, a third thick oxide device (i.e. transistor 32, as shown in FIG. 1B) is added in series with transistors 34 and 36. In this case, the voltage at node 46 ("N1") is limited to $V_{PP}-V_t$ (the threshold voltage of transistor 32). It should be noted that the threshold voltage $V_t$ of transistor 32 is going to be quite large since transistor 32 is a thick oxide transistor and it is biased in a "source-follower" configuration where the raised back bias causes a larger $V_t$ than with the standard "source-grounded" configuration.

These prior art solutions work well to protect thin gate oxide transistors from both large drain-to-source ($V_{DS}$) voltages as well as large gate-to-source voltages ($V_{GS}$), to protect transistors from both hot carrier injection or hot electron injection and gate oxide breakdown. However, these techniques are not always the best solution for speed considerations.

With reference additionally now to FIG. 2, a schematic illustration of a representative circuit 50 in accordance with the present invention is shown implementing a high voltage transistor protection technique of especial applicability to integrated circuit devices utilizing multiple power supply voltages. The circuit 50 comprises series connected N-channel transistors 52 and 54, both having a thin gate oxide. An input line 58 is coupled to the gate terminal of a switching transistor 54 and the drain terminal of transistor 52 defines an output 60.

In accordance with the technique of the present invention, a novel power supply voltage $V_{HVP}$ is generated and applied to the gate terminal 56 of transistor 52. The voltage $V_{HVP}$ is a relatively precise direct current (DC) level which, for some technologies where $V_{PP} > 2*V_{CC}$, obviates the need for the three stack prior art circuit 10 of FIG. 1B. The circuit 50 is much faster than the prior art circuits of FIGS. 1A and 1B while consuming less on-chip area.

$V_{HVP}$ is a DC voltage level regulated to provide proper high voltage protection to transistors 52 and 54 for a particular technology. For example, if $V_{PP}=2.5$ volts, $V_{CC}=0.6$ volts and the technology used to implement transistors 52 and 54 was designed to handle 1.5 volts maximum drain-to-source ("$V_{DS}$") and gate-to-source ("$V_{GS}$") then a $V_{HVP} \leq 1.5$ volts could be generated so that the circuit 50 may be used without reliability concerns. In other words, $V_{HVP}$ should be less than or substantially equal to the maximum gate-to-source voltage $V_{GSMAX}$ of transistor 52 and less than or substantially equal to the maximum drain-to-source voltage $V_{DSMAX}$ of transistor 54 plus the threshold voltage $V_t$ of transistor 52. Otherwise the slower three transistor stack shown in FIG. 1B with transistors 32, 34 and 36 would be required.

With reference additionally now to FIG. 3A, a schematic illustration of the circuit 50 of FIG. 2 is shown implemented in the form of a multi-input NAND gate 300 including one or more additional transistors $54^1$ through $54^N$ in series with the lower switching transistor 54.

With reference additionally now to FIG. 3B, an additional schematic illustration of the circuit 50 of FIG. 2 implemented in the form of a multi-input NOR gate 310 including one or more additional transistors $54_1$ through $54_N$ in parallel with the lower switching transistor 54.

As can be determined from the foregoing, the circuit 50 of the present invention saves on-chip die area and provides enhanced speed of operation in converting voltage levels on advanced integrated circuits.

While there have been described above the principles of the present invention in conjunction with specific circuit configurations and representative voltage levels, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A switching circuit for operation in conjunction with a first supply voltage $V_{PP}$ and a second lower supply voltage $V_{CC}$ wherein $V_{PP} > 2*V_{CC}$, said circuit comprising:

a first transistor having an input terminal thereof coupled between an output of said circuit and an intermediate node, said output capable of transitioning between $V_{PP}$ and a reference voltage level;

a second transistor having a switching input thereof coupled between said intermediate node and a reference voltage line; and a substantially direct current voltage source coupled to said input terminal of said first transistor for supplying a voltage $V_{HVP}$ less than or substantially equal to a maximum gate-to-source voltage $V_{GSMAX}$ of said first transistor, wherein the second lower supply voltage is less than half of the maximum drain-to-source voltage of the first and second transistors.

2. The switching circuit of claim 1 wherein said voltage $V_{HVP}$ is less than or substantially equal to a maximum drain-to-source voltage $V_{DSMAX}$ of said second transistor plus a threshold voltage $V_t$ of said first transistor.

3. The switching circuit of claim 1 wherein said first transistor comprises a MOS transistor.

4. The switching circuit of claim 1 wherein said second transistor comprises a MOS transistor.

5. The switching circuit of claim 1 wherein $V_{PP}$ is substantially 2.5 volts.

6. The switching circuit of claim 1 wherein $V_{CC}$ is substantially 0.6 volts.

7. The switching circuit of claim 1 wherein $V_{HVP}$ is substantially 1.5 volts.

8. The switching circuit of claim 1 further comprising:

at least one other transistor having a switching input thereof, said at least one other transistor being coupled between said second transistor and said reference voltage line, said switching input of said at least one other transistor for implementing a NAND logic function for said switching circuit.

9. The switching circuit of claim 1 further comprising:

at least one other transistor having a switching input their, said at least one other transistor being coupled in parallel with said second transistor between said intermediate node and said reference voltage line, said switching input of said at least one other transistor for implementing a NOR logic function for said switching circuit.

10. A transistor protection method for a switching circuit having an output thereof transitioning between a first supply voltage $V_{PP}$ and a reference voltage level and an input thereof transitioning between a second supply voltage level $V_{CC}$ and said reference voltage level wherein $V_{PP} > 2*V_{CC}$, said method comprising:

providing at least two transistors In series between said output and said reference voltage level, providing a substantially direct current voltage $V_{HVP}$ to a gate terminal of a first one of said transistor wherein $V_{HVP}$ is less than or substantially equal to a maximum gate-to-source voltage $V_{GSMAX}$ of said first one of said transistors; and coupling said input to a gate terminal of a second one of said transistors, wherein the second supply voltage level is less than half of the maximum drain-to-source voltage of the at least two transistors.

11. The transistor protection method of claim 10 wherein said step of providing a substantially direct current voltage is carried out by:

providing a substantially direct current voltage $V_{HVP}$ which is less than or substantially equal to a maximum drain-to-source voltage $V_{DSMAX}$ of said second one of said transistors plus a threshold voltage $V_t$ of said first one of said transistors.

12. The transistor protection method of claim 10 wherein said step of providing said at least two transistors is carried out by:

providing at least two MOS transistors in series between said output and said reference voltage level.

13. The transistor protection method of claim 10 wherein said step of providing at least two transistors is carried out by:

providing at least two N-channel MOS transistors in series between said output and said reference voltage level.

14. The transistor protection method of claim 10 wherein said first supply voltage $V_{PP}$ is substantially 2.5 volts.

15. The transistor protection method of claim 10 wherein said second supply voltage $V_{CC}$ is substantially 0.6 volts.

16. The transistor protection method of claim 10 wherein said substantially direct current voltage $V_{HVP}$ is substantially 1.5 volts.

17. The transistor protection method of claim 10 further comprising:

further coupling at least one other transistor between said second one of said transistor and said reference voltage level; and coupling a switching input of said at least one other transistor for implementing a NAND logic function for said switching circuit.

18. The transistor protection method of claim 10 further comprising:

further coupling at least one other transistor in parallel with said second one of said transistors; and coupling a switching input of said at least one other transistor for implementing a NOR logic function for said switching circuit.

* * * * *

UNITED STATES PATENT AND TRADEMARK OFFICE
CERTIFICATE OF CORRECTION

PATENT NO. : 6,731,156 B1
DATED : May 4, 2004
INVENTOR(S) : Michael C. Parris and Kim C. Hardee It is certified that error appears in the above-identified patent and that said Letters Patent is hereby corrected as shown below:

Column 5,
Line 34, "their" should be -- thereof --
Line 47, "In" should be -- in --
Line 50, "transistor" should be -- transistors --

Column 6,
Line 37, "transistor" should be -- transistors --

Signed and Sealed this

Eighth Day of February, 2005

JON W. DUDAS
*Director of the United States Patent and Trademark Office*